United States Patent
Lindsey et al.

(10) Patent No.: US 7,459,914 B2
(45) Date of Patent: Dec. 2, 2008

(54) SYSTEMS AND METHODS FOR ELECTRICAL LEAKAGE DETECTION

(75) Inventors: Robert Wayne Lindsey, Washington, IL (US); Jennifer Leah Lindsey, Washington, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 11/589,831

(22) Filed: Oct. 31, 2006

(65) Prior Publication Data

US 2008/0129308 A1    Jun. 5, 2008

(51) Int. Cl.
*G01R 31/08*    (2006.01)
*H02H 9/08*    (2006.01)

(52) U.S. Cl. .................. 324/525; 324/522; 361/42

(58) Field of Classification Search .............. 324/525, 324/500, 503, 509–512, 522, 537, 771; 361/42
See application file for complete search history.

(56) References Cited

U.S. PATENT DOCUMENTS

| | | | | |
|---|---|---|---|---|
| 4,002,968 | A | * | 1/1977 | Reid ........................ 324/509 |
| 4,016,489 | A | * | 4/1977 | Adams et al. .............. 324/510 |
| 4,253,056 | A | * | 2/1981 | Chaudhary ................ 324/509 |
| 4,394,615 | A | * | 7/1983 | Rocci, Jr. .................. 324/510 |
| 5,481,194 | A | * | 1/1996 | Schantz et al. ............. 324/522 |
| 6,678,132 | B1 | | 1/2004 | Carruthers et al. |
| 6,700,384 | B2 | | 3/2004 | Yugou |
| 6,833,708 | B2 | * | 12/2004 | Furukawa .................. 324/426 |
| 6,906,535 | B2 | * | 6/2005 | Murphy et al. ............. 324/713 |
| 6,970,807 | B2 | | 11/2005 | Kito et al. |
| 6,977,518 | B2 | | 12/2005 | Higashihama et al. |
| 6,992,490 | B2 | | 1/2006 | Nomoto et al. |
| 7,030,623 | B1 | | 4/2006 | Carpenter |
| 2001/0052777 | A1 | | 12/2001 | Belau et al. |
| 2004/0004481 | A1 | | 1/2004 | Jin |
| 2004/0130326 | A1 | | 7/2004 | Yamamoto |
| 2005/0146335 | A1 | | 7/2005 | Wild |
| 2006/0006840 | A1 | | 1/2006 | Furukawa |
| 2006/0114000 | A1 | | 6/2006 | Scholl et al. |

OTHER PUBLICATIONS

U.S. Appl. No. 11/289,291, filed Nov. 30, 2005, by Lindsey, et al.

* cited by examiner

*Primary Examiner*—Vincent Q. Nguyen
*Assistant Examiner*—Hoai-An D Nguyen
(74) *Attorney, Agent, or Firm*—Finnegan, Henderson, Farabow, Garrett & Dunner

(57) ABSTRACT

Systems and methods are disclosed for detecting balanced electrical leakage between a power source and a machine frame. In one embodiment, a balanced fault detection system for a machine includes a power source that is electrically insulated from a machine frame and a leakage detection switch that is connected to a ground. The balanced fault detection system also includes a leakage detection resistor that is interposed between a power source terminal and the switch having a leakage detection resistance. The balanced fault detection system further includes a voltage measuring device that measures voltages of the power source at positive and negative voltage sides of the ground and a leakage calculator that calculates a leakage resistance of the machine based on the measured voltages at the positive and negative voltage sides and the leakage detection resistance.

19 Claims, 2 Drawing Sheets

SYSTEMS AND METHODS FOR ELECTRICAL LEAKAGE DETECTION

TECHNICAL FIELD

This disclosure relates generally to electrical leakage detection systems, and more particularly, to electrical leakage detection systems for detecting leakage currents in high voltage direct current systems used in machines.

BACKGROUND

A high voltage DC power supply system is required for driving an electric machine that incorporates a high voltage (HV) electrical drive motor and electric auxiliaries. The integrity of the high voltage system is critical to the reliability and safety of the machine. Typically, the machine frame will be electrically isolated from the terminals or conductors of the high voltage power supply.

Under normal conditions, leakage currents on the order of microamps exist between the conductors of the high voltage power supply and the machine frame. Thus, the leakage resistances between the conductors of the high voltage power supply and the frame are normally very high. However, electric current from a high voltage power supply may leak to a machine frame. Such leakage currents, when significant, may be an indication of machine component fatigue or failure of a conductor's insulation. In order to ensure the proper operating conditions and the safety of the machines, it is necessary to detect electrical leakage between the conductors of the high voltage power supply and the machine frame.

Conventional systems and methods have been implemented to detect electrical leakage. For example, U.S. Pat. No. 6,700,384 to Yugou discloses a power source device having a cell unit comprising a plurality of cells. In Yugou, a first current line having two voltage dividing resistors interposed therebetween is connected between a positive side terminal and a negative side terminal of the cell unit. A second current line having two protection resistors and two detection resistors interposed therebetween is also connected between a positive side terminal and a negative side terminal of the cell unit. An intermediate point of the second line is grounded via an insulation resistor. The voltage difference between a voltage ($V_1$, $V_2$) detected by the detection resistors and a reference voltage ($V_c$) obtained from a point of connection between the voltage dividing resistors is provided as the input to two Op-Amps serving as the input voltage ($V_{1IN}$, $V_{2IN}$). Based on the output voltage ($V_{1OUT}$, $V_{2OUT}$) obtained from the Op-Amps, leakage occurrence is detected.

While prior art systems may be effective to some extent for detecting electrical leakage, they do not address detecting electrical leakage in a balanced fault condition. The disclosed embodiments improve upon prior art systems by providing a leakage detection mechanism that detects electrical leakage in a circuit with balanced leakage resistance.

SUMMARY OF THE INVENTION

Systems and methods are disclosed for detecting balanced electrical leakage between a power source and a machine frame. In accordance with one aspect of the disclosure, a balanced fault detection system for a machine includes a power source that is electrically referenced to a machine frame and a leakage detection switch that is connected to the same machine frame. The balanced fault detection system also includes a leakage detection resistor that is interposed between a power source terminal and the switch having a known resistance for leakage detection. The balanced fault detection system further includes a voltage measuring device that measures voltages of the power source at positive and negative voltage sides of reference and a leakage calculator that calculates a leakage current of the machine based on the measured voltages at the positive and negative voltage sides, the leakage detection resistance and other known impedances of the HV system.

In accordance with another aspect of the disclosure, a method for detecting balanced electrical leakage between a power source and a machine frame ground includes connecting a leakage detection resistor between a terminal of the power source and the frame ground, measuring a first voltage at a positive voltage side of the power source, and measuring a second voltage at a negative voltage side of the power source. The method further includes an intentional circuit unbalance based on the first and the second voltage measurements and determining a leakage resistance between the terminals of the power source and the frame ground based on the first and second voltages and a resistance of the leakage detection resistor.

BRIEF DESCRIPTION OF THE DRAWINGS

The accompanying drawings, which are incorporated in and constitute a part of this specification, illustrate exemplary embodiments and together with the description, serve to explain these disclosed embodiments. In the drawings.

DETAILED DESCRIPTION

Figure 1:
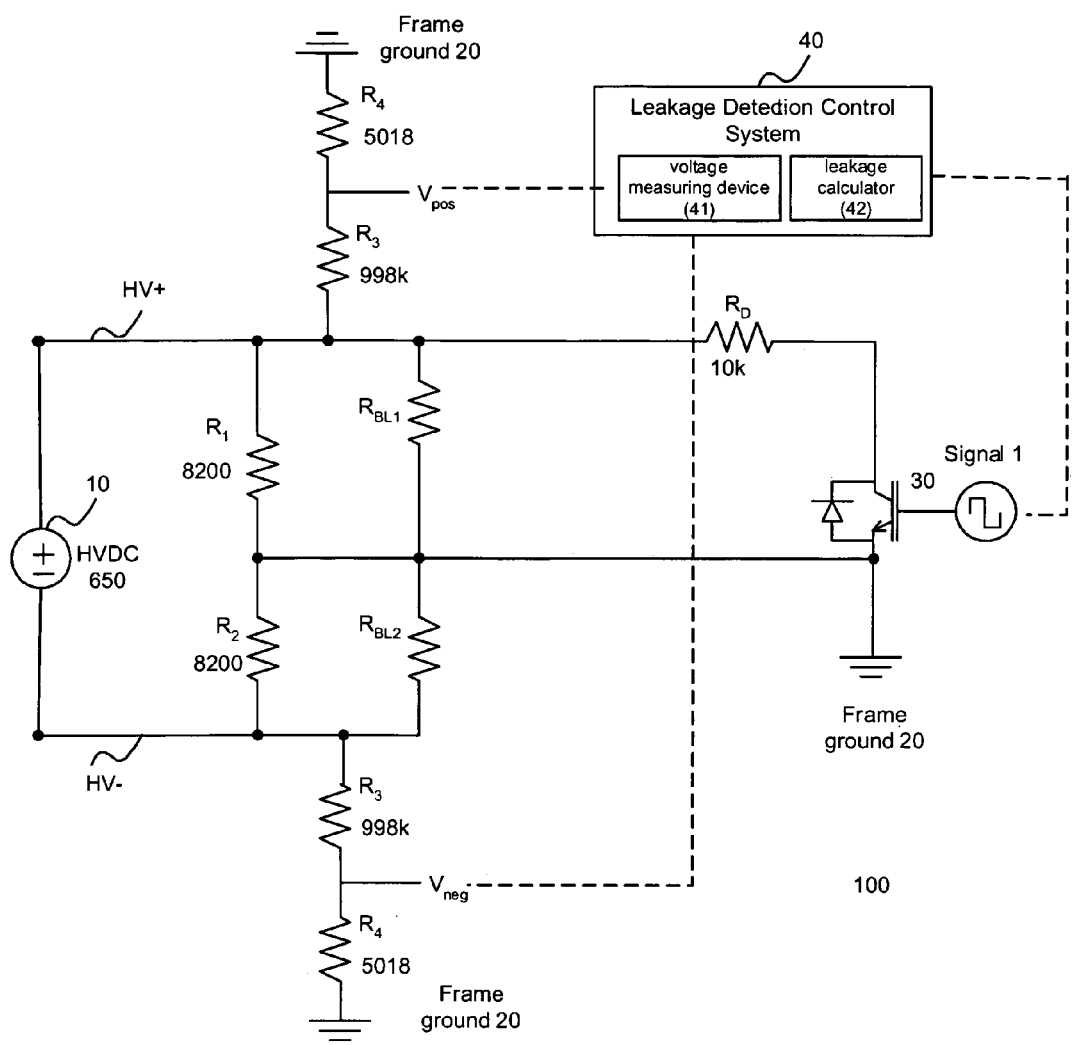
FIG. 1 is an electrical leakage detection circuit consistent with the disclosed embodiments.

Reference will now be made in detail to the disclosed embodiments, examples of which are illustrated in the accompanying drawing. Wherever possible, the same reference numbers will be used in the drawing to refer to the same or like parts.

In the disclosed embodiments, a machine may refer to a petroleum-electric hybrid powered machine, such as a hybrid-electric vehicle which uses internal combustion engines and electric batteries, fuel cell, or other electrical power source to power electric motors. A machine may also refer to a machine with one or more electric motors and an electric power source such as an electric vehicle.

FIG. 1 illustrates an electrical leakage detection circuit 100 consistent with the disclosed embodiments. Electrical leakage detection circuit 100 may be used to detect the presence of an electrical leakage current between a terminal of a high voltage DC power supply and the frame of a machine. In one embodiment, a "frame" may refer to the conductive housing of the machine containing the high voltage DC power supply.

Electrical leakage detection circuit 100 is configured to detect electrical leakage current (e.g., an unacceptably low leakage-resistance) between a terminal of a high voltage DC power supply 10 and the frame ground 20 of the machine containing power supply 10. High voltage DC power supply 10 may be a generator or a battery or other suitable power source. Positive high voltage bus HV+ is connected to the positive terminal of high voltage DC power supply 10. Negative high voltage bus HV− is connected to the negative terminal of high voltage DC power supply 10. The frame of the machine containing the power supply may be referred to as frame ground 20.

$R_1$ and $R_2$ are two resistors of equal resistance providing means to balance and reference the high voltage buses HV+ and HV− equally around frame ground 20. $R_3$ and $R_4$ form a voltage divider that is used to measure $V_{pos}$ and $V_{neg}$ in reference to frame ground 20. As shown in FIG. 1, in one embodiment, the high voltage DC power supply is a 650-volt power supply, although other types of power supplies may also be implemented consistent with the disclosed embodiments. $R_1$ and $R_2$ are two resistors of 8200Ω. $R_3$ and $R_4$ are resistors of 998 kΩ and 5018Ω, respectively. The values of resisters $R_1$ through $R_4$ are exemplary and may include other values consistent with the disclosed embodiments.

The leakage resistance between positive high voltage bus HV+ and frame ground 20 is shown in FIG. 1 as a leakage resistance $R_{BL1}$. The leakage resistance between negative high voltage bus HV− and frame ground 20 is shown as a leakage resistance $R_{BL2}$. Under normal conditions (e.g., when the machine has no electrical fault), leakage resistance ($R_{BL1}$ and $R_{BL2}$) are very high values (e.g., greater than 1MΩ). When the resistance of $R_{BL1}$ equals the resistance of $R_{BL2}$, the leakage resistance is evenly distributed between the positive high voltage bus HV+, frame ground 20, and the negative high voltage bus HV−. Thus, circuit 100 is considered to be in a balanced condition. Conversely, when the resistance of $R_{BL1}$ does not equal that of $R_{BL2}$, circuit 100 is considered to be in an unbalanced condition.

When circuit 100 is unbalanced, the voltage across positive high voltage bus HV+ and frame ground 20 does not equal the voltage across the frame ground 20 and the negative high voltage bus HV−. After defining that HVDC=(HV+)−(HV−), this ground fault detection (GFD) unbalance of circuit 100 may be defined as follows:

$$\text{GFD Unbalance} = 1 - \left( \frac{HV-}{\frac{HVDC}{2}} \right) \quad (1)$$

$V_{neg}$ and $V_{pos}$ refer to the voltage measurements across the two resistors $R_4$. Because $R_3$ and $R_4$ form a voltage divider, when $V_{pos}$ is measured, HV+ can be calculated based on the following equation.

$$HV+ = V_{pos} \times \frac{(R_3 + R_4)}{R_4} \quad (2)$$

Similarly, the voltage across the frame ground 20 and the negative high voltage bus HV− is proportional to $V_{neg}$, and can be calculated based on the following equation.

$$HV- = V_{neg} \times \frac{(R_3 + R_4)}{R_4} \quad (3)$$

By measuring $V_{pos}$ and $V_{neg}$ and applying equations (2) and (3) to equation (1), voltage unbalance of circuit 100, as defined by equation (1), may be determined based on the following equation.

$$\text{GFD Unbalance} = 1 - \left| \frac{V_{neg}}{\frac{(V_{pos}) - (V_{neg})}{2}} \right| \quad (4)$$

Under faulty conditions (e.g., when there is a faulty connection), leakage resistance ($R_{BL1}$ and $R_{BL2}$) may be of unacceptably low values. When the resistance of $R_{BL1}$ equals that of $R_{BL2}$, and the leakage resistance is an unacceptably low value, circuit 100 is considered to be in a balanced fault condition. On the other hand, when the resistance of $R_{BL1}$ does not equal that of $R_{BL2}$, and the leakage resistances are unacceptably low values, circuit 100 is consider to be in an unbalanced fault condition. The range of acceptable leakage resistance values may be determined by information reflecting the type of high voltage power source, the type of machine, the components in the machine's circuit, etc. Further, unbalanced fault conditions may have contributing balanced fault conditions.

When circuit 100 is in an unbalanced fault condition, voltage measurements $V_{pos}$ and $V_{neg}$ may be used to calculate circuit unbalance and detect leakage resistance. However, when circuit 100 is in a balanced fault condition, measurements $V_{pos}$ and $V_{neg}$ may show that the circuit is balanced, and would not detect electrical leakage. To detect the electrical leakage under a balanced fault condition, a leakage detection resistor $R_D$ may be switched into circuit 100.

$R_D$ is a leakage detection resistor that may be switched in and out of circuit 100 to detect electrical leakage. In one embodiment, a transistor may be used to implement this switching, such as transistor switch 30 shown in FIG. 1. Transistor switch may be, for example, an n-channel MOSFET and is turned ON and OFF by a control signal 1. Signal 1 may be an ON-OFF control signal generated by a control circuit (not shown) that generates signals of predetermined or varying values (e.g., voltage values, pulse width, etc.). In one embodiment, transistor switch 30 is connected to frame ground 20 and detection resistor $R_D$, which is connected to the positive high voltage bus HV+.

When signal 1 provides a positive voltage (e.g., a voltage of a predetermined level) to the gate of transistor switch 30, transistor switch 30 is placed in an ON (conducting) condition. This causes $R_D$ to be connected between the positive high voltage bus HV+ and the frame ground 20. In this "ON" condition, resistors $R_1$, ($R_3$+$R_4$), $R_{BL1}$, and $R_D$ form a parallel configuration between the positive high voltage bus HV+ and frame ground 20.

When signal 1 does not provide sufficient positive voltage (e.g., a voltage below the predetermined level) to the gate of transistor switch 30, transistor switch 30 is in an OFF (nonconducting) condition. In this "OFF" condition, $R_D$ is disconnected from frame ground 20, and only resistors $R_1$, ($R_3$+$R_4$), and $R_{BL1}$ form a parallel configuration between the positive high voltage bus HV+ and frame ground 20. In both the "ON" and "OFF" conditions, resistors $R_2$, ($R_3$+$R_4$), and $R_{BL2}$ form a parallel configuration between the negative high voltage bus HV− and frame ground 20.

An electrical leakage detection control system 40, which may include one or more software and/or hardware components, may be implemented to detect electrical leakage in one or more circuits. Electrical leakage detection control system 40 may be implemented within the machine hosting circuit 100. Alternatively, electrical leakage detection control system 40 may be remote to the machine hosting circuit 100, and communicate with the machine and circuit 100 through a wireless communication network.

Electrical leakage detection control system 40 may include one or more devices that take voltage and/or current measurements in a circuit. For example, a voltage measuring device 41 may be configured to measure $V_{pos}$ and $V_{neg}$ in circuit 100. Electrical leakage detection control system 40 may also include a leakage calculator 42 that performs calculations necessary to determine circuit unbalance, leakage resistances, leakage currents, etc. Leakage calculator 42 may be configured by hardware components such as gate arrays (e.g., FPGA, ASICS), or by software. Additionally, electrical leakage detection control system 40 may provide data to other systems for further processing.

In one embodiment, the leakage resistance of circuit 100 may be balanced. That is, the resistance of $R_{BL1}$ equals that of $R_{BL2}$ (and transistor switch 30 is OFF). In this condition, circuit 100 is balanced although $R_{BL1}$ and $R_{BL2}$ may be of an undesired resistance (e.g., a low resistance out of the acceptable range). Under normal conditions, $R_{BL1}$ and $R_{BL2}$ are high resistances. When there is a component failure, insulation breakdown, or other type of fault, $R_{BL1}$ and $R_{BL2}$ may be of undesired low resistances. That is, circuit 100 is considered to be in a balanced fault condition. To detect if undesired electrical leakage paths exist between negative and positive high voltage buses (i.e., HV− and HV+) and frame ground 20, electrical leakage detection control system 40 may be configured to perform a leakage detection process as described below.

Figure 2:
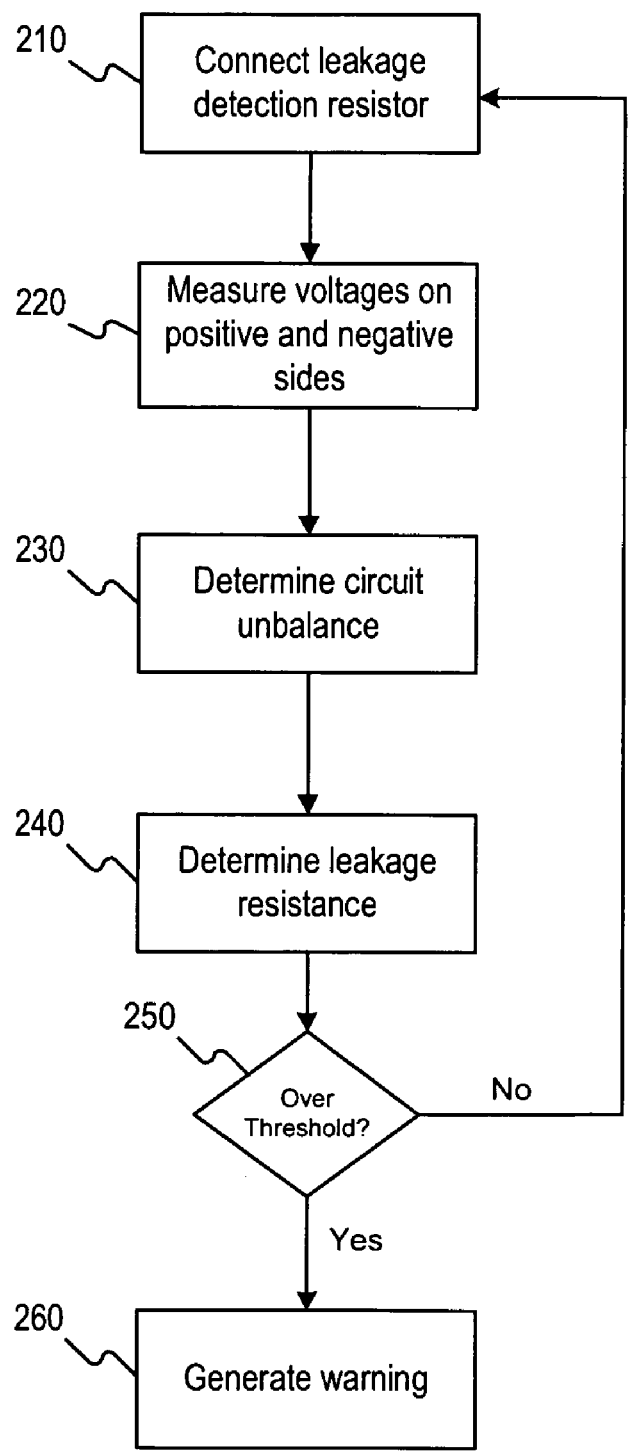
FIG. 2 is a flow chart of an exemplary process for detecting electrical leakage consistent with the disclosed embodiments.

FIG. 2 illustrates an exemplary process for detecting electrical leakage in a balanced fault condition consistent with the disclosed embodiments. To detect an undesired electrical leakage resistance in a balanced fault condition in circuit 100, first, electrical leakage detection control system 40 may use control signal 1 to turn on transistor switch 30. Thus, $R_D$ is switched into circuit 100 to generate an offset voltage (Step 210). Voltage measuring device 41 may then measure $V_{neg}$ and $V_{pos}$ (Step 220). Based on equation (4), leakage calculator 42 may calculate the unbalance in circuit 100 caused by $R_D$ (Step 230).

In circuit 100, the resistance of the parallel configuration of $R_1$ and $(R_3+R_4)$ can be calculated based on the following equation.

$$R_{1\|34} = \frac{R_1 \times (R_3 + R_4)}{R_1 + (R_3 + R_4)} \tag{5}$$

The resistance of the parallel configuration of $R_1$, $(R_3+R_4)$, and $R_{BL1}$ may be calculated based on the following equation.

$$R_{equivalent} = \frac{R_{BL1} \times R_{1\|34}}{R_{BL1} + R_{1\|34}} \tag{6}$$

When $R_D$ is switched into circuit 100 (e.g., transistor switch 30 is "ON"), the resistance of the parallel configuration of $R_{equivalent}$ and $R_D$ may be calculated based on the following equation.

$$R_{(E\|D)} = \frac{R_{equivalent} \times R_D}{R_{equivalent} + R_D} \tag{7}$$

The resistance of the parallel configuration of $R_2$, $(R_3+R_4)$, and $R_{BL2}$ also equals that of $R_{equivalent}$ because $R_{BL2}$ equals to $R_{BL1}$, and $R_2$ equals $R_1$. Therefore, when $R_D$ is switched into circuit 100, the voltages distribution across the positive high voltage bus HV+, frame ground 20, and the negative high voltage bus HV− can be expressed using the following equation.

$$\frac{V_{pos}}{V_{neg}} = \frac{R_{(E\|D)}}{R_{equivalent}} \tag{8}$$

Combining equations (7) and (8), $R_{equivalent}$ can be determined based on the following equation.

$$R_{equivalent} = R_D \left| \frac{V_{neg} - V_{pos}}{V_{pos}} \right| \tag{9}$$

Thus, by switching $R_D$ (known resistance) into circuit 100 and measuring $V_{pos}$ and $V_{neg}$, electrical leakage detection control system 40 may determine $R_{equivalent}$ based on equation (9). Leakage calculator 42 may then calculate leakage resistance $R_{BL1}$ from $R_{equivalent}$ based on equations (5) and (6) (Step 240).

In one embodiment (under normal conditions) of circuit 100, $R_{BL1}$ and $R_{BL2}$ may be a high resistance, and $R_D$ may be a predetermined resistance, such as 10 kΩ. Because $R_{BL1}$ and $R_{BL2}$ are balanced leakage resistances ($R_{BL1}=R_{BL2}$), $R_D$ is switched into circuit 100 to detect the leakage resistance $R_{BL1}$ and $R_{BL2}$. In this example, when $R_D$ is switched into circuit 100, $V_{pos}$ and $V_{neg}$ are measured at 1.168 v and 2.117 v, respectively. According to equation (9):

$$R_{equivalent} = R_D \left| \frac{V_{neg} - V_{pos}}{V_{pos}} \right| = 10 \text{ k}\Omega \times 0.8132 = 8132 \text{ }\Omega.$$

Applying equations (5) and (6), when $R_{equivalent}$ is 8132Ω, the leakage resistance $R_{BL1}$ can be calculated to be 16.4 MΩ. The leakage current can therefore be determined as follows:

$$I_{leak} = \frac{HVDC}{(R_{BL1} + R_{BL2})} = \frac{650}{(16.4 + 16.4) \times 10^6} = 1.98 \text{ }\mu A$$

The GFD unbalance of circuit 100 can be determined based on equation (4).

$$GFD \text{ Unbalance} = 1 - \left| \frac{V_{neg}}{\frac{(V_{pos}) - (V_{neg})}{2}} \right| \approx -29\%.$$

As exemplified above, under normal conditions, leakage resistance is a high value (e.g., 16.4 MΩ) and the leakage current is at a low level (1.98 µA). Thus, in this example, when the detector resistor $R_D$ is switched into circuit 100, it causes a GFD unbalance of −29%.

In another exemplary embodiment (under faulty conditions) of circuit 100, $R_{BL1}$ and $R_{BL2}$ may be of an unacceptably low resistance, and $R_D$ may be 10 kΩ. Because $R_{BL1}$ and $R_{BL2}$ are balanced fault resistances ($R_{BL1}=R_{BL2}$), $R_D$ is switched into circuit 100 to detect the leakage resistance $R_{BL1}$ and $R_{BL2}$. When $R_D$ is switched into circuit 100, $V_{pos}$ and $V_{neg}$ are measured at 1.390 v and 1.895 v, respectively. According to equation (9):

$$R_{equivalent} = R_D \left| \frac{V_{neg} - V_{pos}}{V_{pos}} \right| = 10 \text{ k}\Omega \times 0.3636 = 3636 \text{ }\Omega.$$

The GFD unbalance can be determined according to equation (4).

$$\text{GFD Unbalance} = 1 - \left| \frac{V_{neg}}{\frac{(V_{pos}) - (V_{neg})}{2}} \right| \approx -15\%.$$

This lower GFD unbalance (15% compared to 29%) is caused by the reduced leakage resistance. Applying equations (5) and (6), when $R_{equivalent}$ is 3636Ω, the leakage resistance $R_{BL1}$ can be determined to be 6577Ω. The leakage current can therefore be determined as follows:

$$I_{leak} = \frac{HVDC}{(R_{BL1} + R_{BL2})} = 49 \text{ mA}$$

As exemplified above, under faulty conditions, leakage resistance may be a relatively low value (6577Ω) and the leakage current may be an unacceptably high value (49 mA). The relatively low leakage resistance and relatively high leakage current may indicate component fatigue or failure in a machine.

After calculating leakage resistance $R_{BL1}$ and leakage current $I_{leak}$, leakage detection control system 40 may determine whether a leakage resistance and/or a leakage current is over a threshold value (Step 250). When a leakage resistance and/or a leakage current is not over the threshold value, leakage detection control system 40 may start the leakage detection process again or upon request. When a leakage resistance and/or a leakage current is over the threshold value, leakage detection control system 40 may determine that the machine has a faulty connection or some other type of problem, and generate or issue various levels of warnings (Step 260). Leakage detection control system 40 may transmit warnings to notify, for example, an operator of the machine via a display panel. For instance, upon detection of a leakage current, a display panel may display a message requesting that the machine be serviced.

INDUSTRIAL APPLICABILITY

Methods and systems consistent with the disclosed embodiments may be implemented for leakage detection in an electrical vehicle or a hybrid vehicle. Further, methods and systems consistent with the disclosed embodiments may be used for leakage detection in any type of machine that requires a high voltage power supply for its operations.

Systems and methods consistent with the disclosed embodiments may also be implemented within a machine having a data communication link to provide an error signal to a monitoring system detecting and/or indicating the severity of the fault condition caused by the leakage current. For example, when the leakage current is over a threshold value, the monitoring system may determine that the machine has a faulty connection or some other type of problem. When leakage current is detected, various levels of warnings may be generated to notify, for example, the operator of the machine via a display panel. For instance, upon detection of a leakage current, a display panel may display a message requesting that the machine be serviced.

Systems and methods consistent with the disclosed embodiments may further be implemented within a machine to collect multiple sets of data over a period of time in order to analyze system faults based on the collected data. For example, the electrical leakage detection control system may switch the leakage detection resistor in and out of circuit 100 multiple times over a defined time period. The electrical leakage detection control system may determine the circuit unbalance and leakage resistance each time. The electrical leakage detection control system may further analyze the pattern in the circuit unbalance and leakage resistance data. Based on this analysis, the electrical leakage detection control system may try to identify the electrical/mechanical component fault in the machine hosting circuit 100.

In one embodiment, the electrical leakage detection control system may store patterns of circuit characteristics mapped to various faulty machine conditions, such as a faulty wire connection. For example, the electrical leakage detection control system may detect rapid toggles of voltage values in the $V_{pos}$ and $V_{neg}$ measurements in circuit 100. The electrical leakage detection control system may compare this pattern of voltage toggles against those stored in its data storage. The electrical leakage detection control system may thereby identify this voltage toggle pattern as one or more faulty wire connections in the machine. The voltage toggle patterns can also represent a typical and normal condition, such as when a device or appliance is turned on there may be a known leakage associated with it, and the new leakage becomes the normal condition. Therefore, the leakage detected is a normal condition.

The implementation of the disclosed systems and methods are not limited to the circuit shown in FIG. 1. It will be apparent to those skilled in the art that various modifications and variations of the disclosed embodiments can be made. Additionally, other embodiments of the disclosed methods and systems will be apparent to those skilled in the art from consideration of the specification. It is intended that the specification and examples be considered as exemplary only, with a true scope of the disclosure being indicated by the following claims.

What is claimed:

1. A balanced fault detection system for a machine, comprising:
 a power source, electrically referenced to a machine frame;
 a leakage detection switch, connected to a ground;
 a leakage detection resistor, interposed between a power source terminal and the switch having a leakage detection resistance;
 a voltage measuring device that measures voltages of the power source at positive and negative voltage sides of the ground;
 a first and a second voltage divider, each being interposed between a terminal of the power source and the machine frame, wherein a leakage resistance is evenly distributed between the first and the second voltage dividers; and
 a leakage calculator that calculates the leakage resistance and a leakage current of the machine based on the measured voltages at the positive and negative voltage sides, the leakage detection resistance, and a known power source impedance.

2. The system of claim 1, wherein the first and the second voltage divider each comprises two resistors.

3. The system of claim 2, wherein the voltage measuring device measures a voltage of the positive voltage side across a first resistor of the first voltage divider, and measures the voltage of the negative voltage side across a second resistor of the second voltage divider.

4. The system of claim 1, wherein the leakage detection resistor is switched in and out of the balanced fault detection circuit by the leakage detection switch.

5. The system of claim 1, wherein the leakage resistance is between a terminal of the power source and the ground.

6. The system of claim 1, wherein the machine is a hybrid-electric vehicle or an electrical vehicle.

7. The system of claim 1, wherein the leakage calculator further determines a leakage current based on the leakage resistance and voltage of the power source.

8. A method for detecting balanced electrical leakage between a power source and a frame ground of a machine, comprising:
connecting a leakage detection resistor between a terminal of the power source and the frame ground;
measuring a first voltage at a positive voltage side of the power source;
measuring a second voltage at a negative voltage side of the power source;
determining a first circuit unbalance based on the first and the second voltage measurements;
determining a first leakage resistance between the terminal of the power source of the frame ground based on the first and second voltages and a resistance of the leakage detection resistor;
connecting a first voltage divider between the positive voltage side of the power source and the ground; and
connecting a second voltage divider between the negative voltage side of the power source and the ground. wherein the leakage resistance is evenly distributed between the first and the second voltage dividers.

9. The method of claim 8, further including:
disconnecting and reconnecting the leakage detection resistor between the terminal of the power source and the frame ground;
measuring a third voltage at the positive voltage side of the power source;
measuring a fourth voltage at the negative voltage side of the power source;
determining a second circuit unbalance based on the third and the fourth voltage measurements; and
determining a second leakage resistance between the terminal of the power source of the frame ground based on the third and fourth voltages and the resistance of the leakage detection resistor.

10. The method of claim 8, wherein the first leakage resistance exists between the positive voltage side of the power supply and the ground, and between the negative voltage side of the power supply and the ground.

11. The method of claim 8, further including:
determining voltage distribution across the positive terminal of the voltage source, the frame ground, and the negative terminal of the power source.

12. The method of claim 8, further including:
determining a leakage current based on voltage of the power source and the first leakage resistance.

13. The method of claim 12, further including:
defining a threshold leakage current value based on data related to the machine.

14. The method of claim 13, further including:
determining whether the leakage current is over the threshold value; and
outputting a signal if the leakage current is over the threshold value.

15. The method of claim 14, further including:
displaying a message requesting service for the machine based on the output signal.

16. The method of claim 8, further including:
defining a threshold circuit unbalance based on data related to the machine.

17. The method of claim 16, further including:
determining whether the first circuit unbalance is over the threshold value;
outputting a signal if the circuit unbalance is over the threshold value; and
displaying a message warning for faulty machine conditions based on the output signal.

18. The method of claim 9, further including:
analyzing the first and the second circuit unbalances;
analyzing the first and the second leakage resistances; and
identifying a faulty machine condition based on results of the analyses.

19. A fault detection apparatus for a machine, comprising:
a power source, electrically referenced to a machine frame;
a leakage detection switch, connected to a ground;
a leakage detection resistor, interposed between a power source terminal and the switch having a leakage detection resistance;
a voltage measuring device that measures voltages of the power source at positive and negative voltage sides of the ground;
a first and a second voltage divider, each comprises two resistors wherein a leakage resistance is evenly distributed between the first and the second voltage dividers; and
a leakage calculator that calculates the leakage resistance and a leakage current of the machine based on the measured voltages at the positive and negative voltage sides, the leakage detection resistance, and a known power source impedance.

* * * * *